United States Patent

Gaultier et al.

[11] Patent Number: 5,872,528
[45] Date of Patent: Feb. 16, 1999

[54] MULTICHANNEL CODER OF SINGLE-CHANNEL STRUCTURE

[75] Inventors: Philippe Gaultier, Le Chesnay; Patrick Vouillon, Villebon sur Yvette; Simon Fréderic, Elancourt, all of France

[73] Assignee: Sextant Avionique, Velizy Villacoublay, France

[21] Appl. No.: 575,358

[22] Filed: Dec. 20, 1995

[30] Foreign Application Priority Data

Dec. 28, 1994 [FR] France .................................. 94 15767

[51] Int. Cl.⁶ .................................................. H03K 17/94
[52] U.S. Cl. .............................. 341/35; 341/33; 341/192; 345/184; 455/154.1; 455/170.1
[58] Field of Search ........................ 455/154.1, 170.1, 455/178.1, 182.3; 341/35, 33, 190, 192; 345/184; 200/11 TW, 11 DA, 37 A

[56] References Cited

U.S. PATENT DOCUMENTS

| | | | |
|---|---|---|---|
| 3,806,820 | 4/1974 | Uciyama | 325/478 |
| 3,949,304 | 4/1976 | McClaskey | 455/170.1 |
| 4,054,860 | 10/1977 | Henderson et al. | 338/32 |
| 4,243,962 | 1/1981 | Larkin et al. | 455/170.1 |
| 4,295,224 | 10/1981 | Nishimura et al. | 445/170.1 |
| 4,389,732 | 6/1983 | Sasahara et al. | 455/170.1 |
| 4,408,172 | 10/1983 | Perdue | 334/11 |
| 4,492,958 | 1/1985 | Minami | 340/825.25 |

FOREIGN PATENT DOCUMENTS 89 10 606 U   8/1989   Germany.

Primary Examiner—Michael Horabik
Assistant Examiner—Timothy Edwards, Jr.
Attorney, Agent, or Firm—Browdy and Neimark

[57] ABSTRACT

The multichannel coder embodying the invention comprises a knob coupled with a code wheel associated with a means for detecting the angular position and, possibly, the direction of rotation of the wheel. It comprises, on the one hand, a channel selection means incorporated into the knob, and, on the other hand, a means enabling the association, with the information provided by the detection means, of information relating to the channel that has been selected on the aforesaid selection means. The invention can be used to modify parameters.

11 Claims, 3 Drawing Sheets

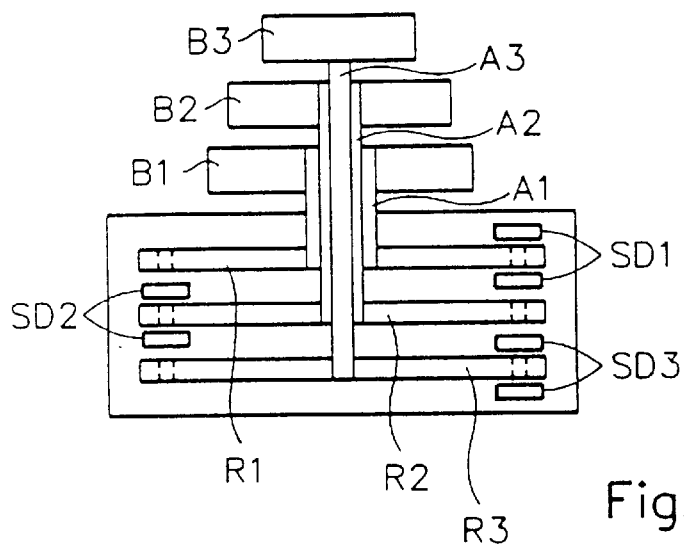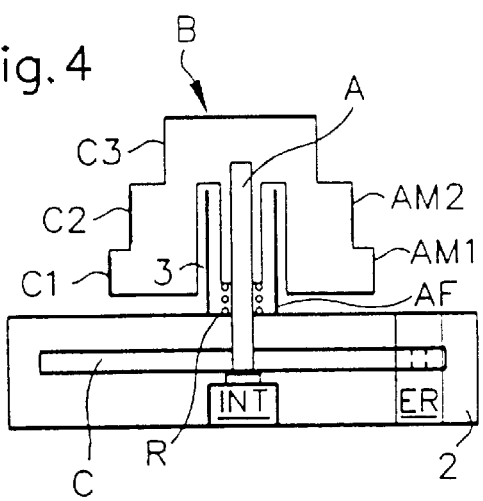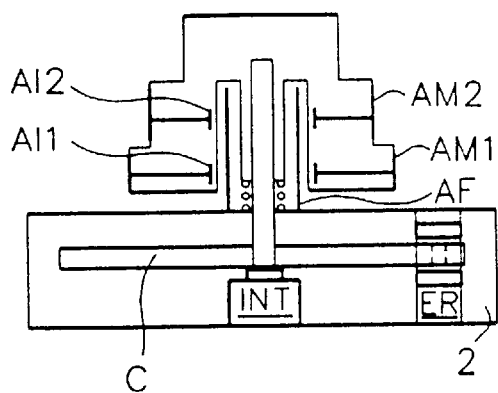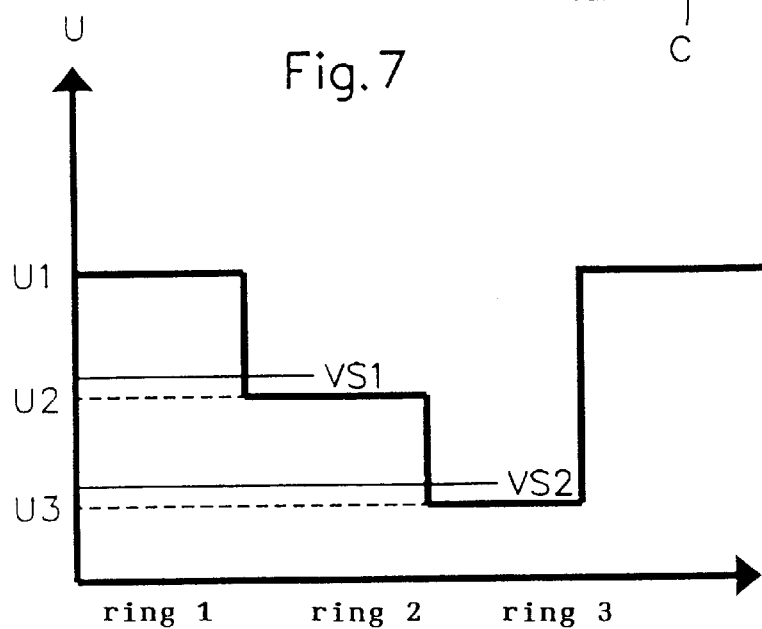

MULTICHANNEL CODER OF SINGLE-CHANNEL STRUCTURE

BACKGROUND OF THE INVENTION

1. Field of the Invention

This invention relates to a multichannel coder enabling process parameters to be modified.

It applies notably, though not exclusively, to aircraft cockpit equipment. Thus, in this type of application, it can be advantageously used e.g. to control an ADF receiver (radio compass).

2. Description of the Prior Art

Single-channel coders are usually comprised of a rotating knob coupled with a code wheel associated with one or more detectors enabling information relating to the angular position of the coder and direction of rotation to be provided.

The design of the code wheel and detectors associated with it depend, of course, on the detection principle applied, and the latter can be of an electromechanical, magnetic, optical or other nature.

As for multichannel coders, these use several single-channel coder structures arranged in such a way that the knobs and the code wheels are disposed coaxially while being offset in relation to one another.

The axes of the knob/code wheel assemblies are then designed to fit coaxially into one another so as to be able to turn in relation to one another.

Advantageously, these knobs are of different diameter so that the superposing thereof defines a cone-shaped assembly in which each of the knobs can be identified by touch.

In view of their structure and the fact that there are as many coders as there are channels, multichannel coders are relatively costly and voluminous devices.

OBJECT OF THE INVENTION

The main object of this invention is to remedy the preceding disadvantages.

SUMMARY OF THE INVENTION

Accordingly, there is provided a a multichannel coder using a single-channel coder structure, i.e. comprising a single knob coupled with a single code wheel associated with a means of detecting the angular position and direction of rotation of the wheel.

According to the invention, this coder is characterized in that it comprises, on the one hand, a channel selection means incorporated into the knob, and, on the other hand, a means enabling the association, with the information provided by the detection means, of information relating to the channel that has been selected on the aforesaid selection means.

Advantageously, the channel selection means can consist of a capacitive type means for detecting the presence of a finger.

In this case, this presence detection means can use a fixed armament of a capacitor, to which a high frequency alternating or pulsed voltage is applied, and at least one external armament of a capacitor integral with the knob and disposed opposite the fixed armament.

A detection device is further provided so as to detect any spurious loss of power caused by contact with a finger on one or other of the mobile armaments.

Of course, the invention is not limited to a capacitive type mode of detection. Such a detection could equally be of the resistive, mechanical, piezoelectric, thermoelectric or even optical type.

BRIEF DESCRIPTION OF THE DRAWINGS

Further features and advantages of the invention will be apparent from embodiments of the invention described, by way of non-limiting examples, in reference to the corresponding accompanying drawings in which:

FIG. 3 is a schematic sectional drawing of a conventional type three-channel coder;

FIG. 4 is a first embodiment of a three-channel coder according to the invention in which channel selection is performed by capacitive effect;

FIG. 5 is another embodiment of the coder represented in FIG. 4;

FIG. 7 is a diagram representing the voltage levels at the terminals of the capacitor system of the capacitive selector, depending on the nature of the action on the knob.

DESCRIPTION OF THE PREFERRED EMBODIMENTS

Figure 1:
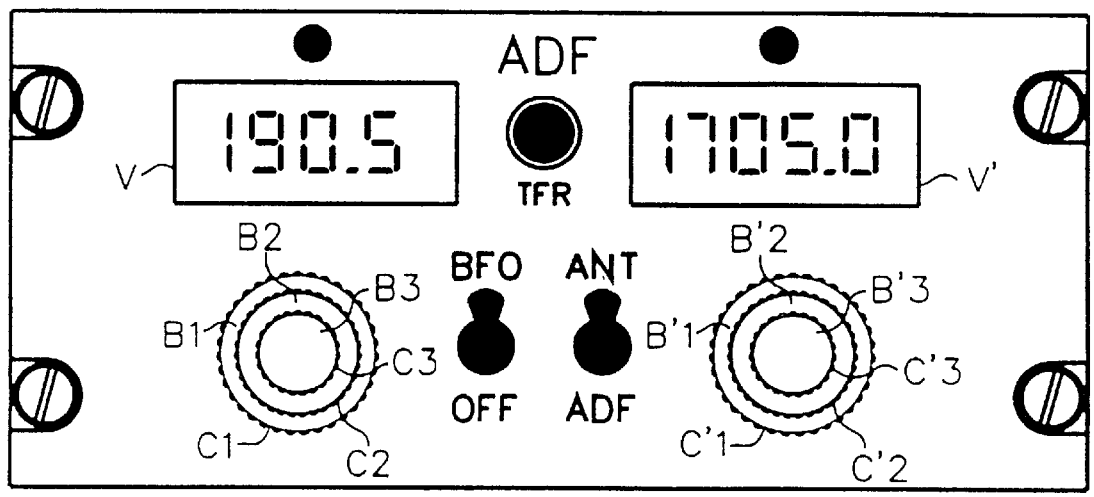
FIG. 1 is a view of the front of an ADF receiver (radio compass) equipping the cockpit of an aircraft.

The front 1 of the ADF receiver, which is represented in FIG. 1, is an example among others of the utilisation of coders in a control panel in the cockpit of an aircraft.

In this example, the front 1 comprises two readouts V, V' with which are associated two respective three-channel coders, e.g. of the type of the one represented in FIG. 3.

The knobs $B_1$, $B_2$, $B_3$, $B'_1$, $B'_2$, $B'_3$ of each of these coders comprise three axially superposed coaxial cylindrical rings of decreasing diameter (from the first ring which is adjacent the front 1 to the last ring which is the furthest away from said front 1).

Figure 2:
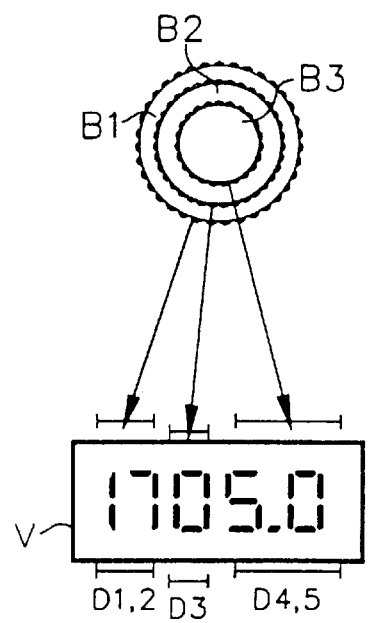
FIG. 2 is a schematic representation illustrating a method of modifying a parameter displayed on a readout associated with a three-channel coder.

Modification of a parameter by means of these coders can be performed digit by digit and/or by groups of digits, e.g. as indicated in FIG. 2.

In this example, a rotation of knob $B_1$ commands a modification (incrementation or decrementation depending on the direction of rotation) of the first two digits $D_{1,2}$ displayed on the readout. The knob $B_2$ is assigned to the central digit $D_3$ whereas the knob $B_3$ controls the modification of the last two digits $D_{4,5}$.

To achieve these results, the solution used up to now consists in using three independent knobs $B_1$, $B_2$, $B_3$ coupled with three respective coders by means of three coaxial axes nesting into one another, namely:

a central axis $A_3$ connecting the knob $B_3$ to the code wheel $C_3$ of the first coder;

a first tubular axis $A_2$ mounted rotatably about the central axis $A_3$ and connecting the knob $B_2$ to the code wheel $C_2$ of the second coder;

a second tubular axis $A_1$ mounted rotatably about the first tubular axis $A_2$ and connecting the knob $B_1$ to the code wheel $C_1$ of the third coder.

Of course, with each code wheel $C_1$, $C_2$, $C_3$ is associated at least one detection system $SD_1$, $SD_2$, $SD_3$ using e.g. two light wave transmitter/receiver couples, the code wheels $C_1$, $C_2$, $C_3$ then being drilled with a multiplicity of holes evenly spread on a concentric circle.

As previously mentioned, the object of the invention is to provide a solution that is simpler, less costly, more efficient and better suited to the digital processing of data.

It consists in using a coder comprising a single code wheel C commanded by a single knob B associated with a selector.

This knob B can then be formed so as to be of a shape similar to that of the set of three knobs $B_1$, $B_2$, $B_3$, used in the previous solution.

Figure 6:
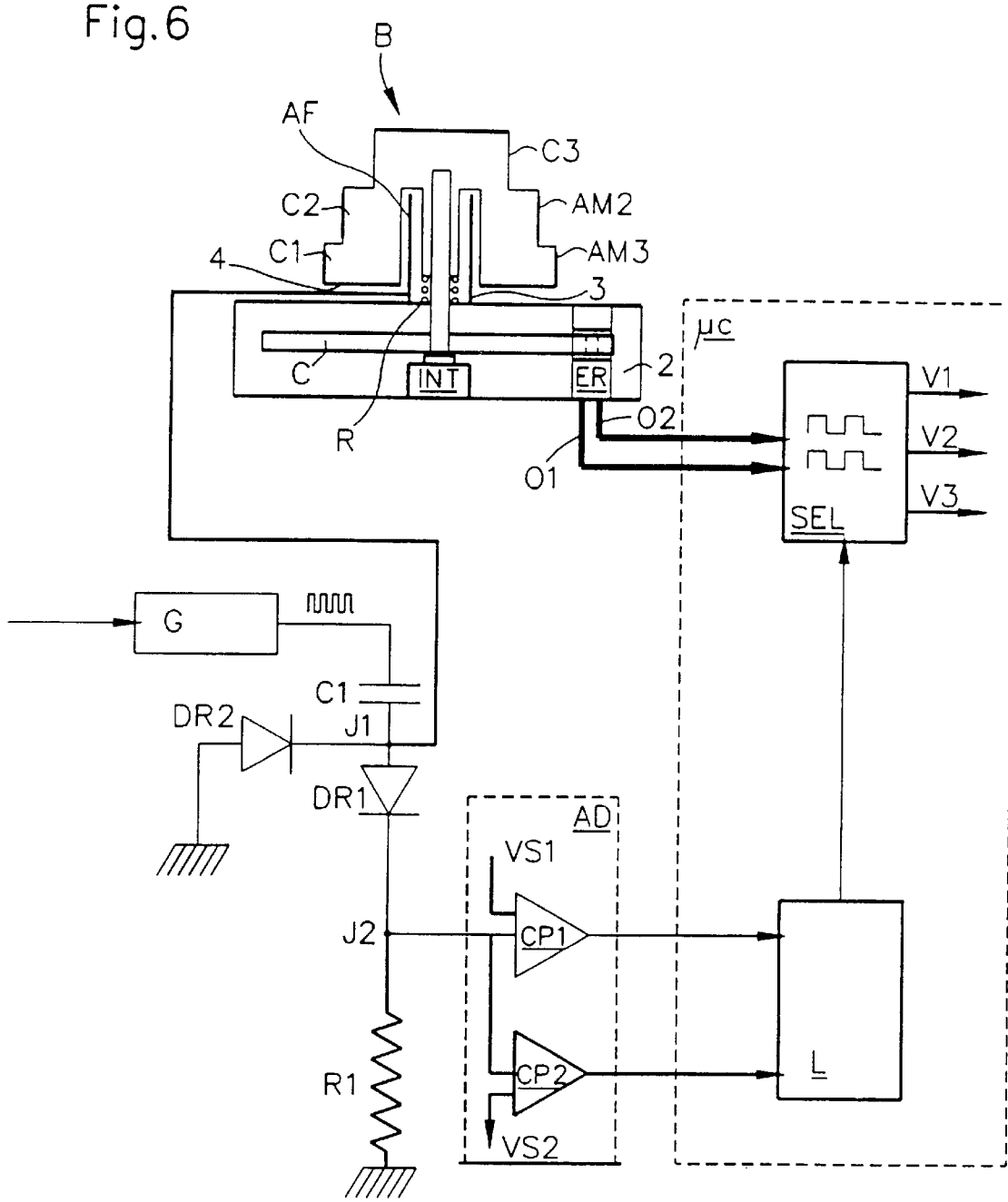
FIG. 6 is a synoptic diagram of the electronic circuit associated with the coder.

Thus, to obtain a coder similar to the one represented in FIG. 3, the knob B can comprise, as illustrated in FIGS. 4, 5 and 6, three superposed coaxial cylindrical rings $C_1$, $C_2$, $C_3$ integral with one another and of different diameter from one to the next.

In these examples, the channel selector uses a capacitive system comprising:

- on the one hand, a cylindrically shaped fixed armament AF of a capacitor, integral with the case 2 of the coder, this armament $AF_1$ fitting into a coaxial annular cavity 3 of the knob B opening out at its base 4, and
- on the other hand, two cylindrically shaped capacitor armaments $AM_1$, $AM_2$ respectively covering the cylindrical rings $C_1$ and $C_2$ of the knob B.

The body of the knob B is, of course, manufactured in a dielectric material such as e.g. a molded plastic material.

As represented in FIG. 6, the channel selection circuit associated with this knob B uses a generator G capable of generating a periodic signal of frequency of the order of a few MHz, e.g. 4 MHz.

This signal is applied to a circuit successively comprising a capacitor $C_1$, a diode $DR_1$ mounted directly and a resistor $R_1$ connected to the ground.

The point of junction $J_1$ between the capacitor $C_1$ and the diode $DR_1$ is connected, on the one hand, to the ground via a diode $DR_2$ mounted in reverse, and, on the other hand, to the fixed armament AF of the capacitive system associated with the knob B.

The point of junction $J_2$ between the diode $DR_1$ and the resistor $R_1$ is connected to a comparison circuit comprising at least two comparators $CP_1$, $CP_2$ which compare the voltage at the terminals of the resistor $R_1$ with two respective threshold voltages $VS_1$, $VS_2$.

The outputs of these two comparators $CP_1$, $CP_2$ are connected to a logic circuit L which commands a selector SEL (multiplexor) with three outputs $V_1$, $V_2$, $V_3$ corresponding to the three channels of the device.

The device then operates as follows:

When only the ring $C_3$ of the knob B is acted upon, no spurious capacity is introduced into the circuit by the capacitive system. The voltage $U_1$ at the point of junction $J_2$ is then higher than the threshold $VS_1$, the outputs of the comparators $CP_1$, $CP_2$ are in the 1.1 state and, therefore, the logic circuit L commands the selector SEL so as to connect the outputs $O_1$, $O_2$ of the coder to the channel $V_1$. Rotation of the knob B thus commands the transmission, on the channel $V_1$, of a pulsed information that can be used e.g. to command the incrementing or decrementing of a digit or group of digits of a parameter.

In the case of the rotation of the knob B being generated by action on the ring $C_2$, the contact of the fingers on the cylindrical electrode $AM_2$ introduces a stray capacity which brings about an attenuation of the signal as a function of the capacity introduced.

This capacity, which is substantially proportional to the area facing the armaments $AM_2$ and AF and inversely proportional to the distance between these armaments, causes a voltage drop which brings the voltage at the point $J_2$ to a value $U_2$ below the voltage threshold $VS_1$ but above the voltage threshold $VS_2$. The outputs of the comparators $CP_1$, $CP_2$ are then in the logic state 01. In view of this state, the logic circuit commands the selector SEL so as to connect the outputs $O_1$, $O_2$ of the coder (angular position/direction of rotation coding) to the channel $V_2$.

Similarly, when the rotation of the knob B is produced by action on the ring $C_3$, the contact of the fingers on the cylindrical armament $AM_3$ introduces a stray capacity e.g. of a value equal to half the previous value, which generates an attenuation of the voltage at point $J_2$ which changes to a value $U_3$ below the threshold $S_2$. The outputs of the comparators $CP_1$, $CP_2$ are then in the 0.0 state. In view of this state, the logic circuit L the n commands the selector SEL so as to connect the outputs $O_1$ and $O_2$ of the coder to the channel $V_3$.

The invention is not, of course, limited to the embodiment of the channel selection method previously described. The outputs $O_1$ and $O_2$ of the coder could thus be directly transmitted to a microcontroller $\mu c$ indicated in broken lines.

The channel selection information is transmitted in this case to this microcontroller $\mu c$ by an analog-to-digital converter AD (also in broken lines) of which the input is connected to the point $J_2$. This solution enables a channel identification datum to be associated with each datum issued by the coder. These data are then processed by the microcontroller $\mu c$ as a function of the application programme associated with it.

In the other embodiment represented in FIG. 5, the capacitive detection system associated with the knob B' uses, in addition to the external capacitor armaments $AM'_2$, $AM'_3$, coaxial annular internal armaments $AI_2$, $AI_3$ situated near the fixed armament AF'.

The area of these internal armaments $AI_2$, $AI_3$, which are respectively connected to the external armaments $AM'_2$, $AM'_3$, is then determined in order to obtain the highest possible voltage differences $U_1$–$U_2$, $U_2$–$U_3$ and $U_1$–$U_3$ in order to reduce channel selection error risks as much as possible.

One advantage of the solutions previously described consists in that they enable the easy addition, to the knob functions, of an additional function such as e.g. a validation function.

Indeed, all that needs be done is to ensure that the axis connecting the knob to the code wheel is axially mobile so as to be able to operate a switch INT housed in the coder case. A retracting spring R can then be provided to maintain the switch INT in the neutral position and to only obtain a change of state of the switch INT after an axial stress exerted on the knob B, against the action exerted by the spring R.

In the multichannel coders previously described, the fact that the knob is a single piece and that, consequently, the cylindrical ring-shaped elements are integral with one another does not pose any particular problem as regards ergonomics.

In fact, the operator does not look at the coder while it is being used but rather the parameter he modifies and which is displayed on the readout.

Moreover, by way of the arrangements previously described, the microcontroller or possibly the processor associated with it, can command signaling means indicating to the operator the function of the ring that is touched, even before it is operated. This signaling can e.g. consist of a graphical modification of the parameter displayed such as e.g. a brightening, reverse video display, a color change, a flashing. This signaling could also be provided by a sonorous information such as e.g. a vocal message produced by voice synthesis.

We claim:

1. A multichannel coder of the type comprising:
   a rotary knob coupled with a code wheel associated with rotation detection means for detecting an angular position and a direction of rotation of the wheel, said knob comprising at least two sensitive zones susceptible of being separately brought into contact with an operator's finger, a channel selection means incorporated into the knob and comprising a fixed capacitor armament integral with a fixed structure of the coder, and at least one mobile capacitor armament integral with the knob and facing said fixed armament so as to form a capacitor therewith, said at least one mobile armament being respectively in electrical contact with only one of said sensitive zones, said selection means providing a channel selection information depending on which of said sensitive zones an operator's finger is in contact with, and a means for associating rotation information provided by said rotation detection means with said channel selection information provided by said selection means.

2. The coder as claimed in claim 1, wherein said fixed armament receives a high-frequency alternating or pulsed voltage.

3. The coder as claimed in claim 1, wherein said fixed armament is of cylindrical tubular shape and fits into a coaxial annular cavity formed in said knob and which opens out at the level of a base of said knob.

4. The coder as claimed in claim 1, wherein said knob comprises three rings of different diameter defining three respective sensitive zones susceptible of being separately brought into contact with an operator's finger, only two of said three rings being covered with an external armament associated with two respective internal mobile armaments facing said fixed armament, said selection means providing a channel selection information depending on which of said three sensitive zones an operator's finger is in contact with.

5. The coder as claimed in claim 1, wherein said channel selection means comprises at least one comparator for comparing the voltage applied to said fixed armament with a threshold value, and a logic circuit associated with a channel selector which receives the data output by said detection means and transmits said data along a channel according to the level of said voltage.

6. The coder as claimed in claim 1, wherein said selection means comprises an analog-to-digital converter which receives a signal representative of the voltage applied to said fixed armament and which transmits a corresponding digital signal to a microcontroller which receives the data provided by said rotation detection means of said coder.

7. The coder as claimed in claim 1, further comprising a means for signaling the channel selected.

8. The coder as claimed in claim 1, wherein the unit comprising the knob, the code wheel and a shaft coupling the knob with the code wheel, is axially mobile with a retracting spring in order for said unit to be able to operate a switch by exerting on the knob a force opposing the action of the spring.

9. The coder as claimed in claim 1, wherein said at least mobile armament is cylindrically shaped and covers a ring of said knob.

10. The coder as claimed in claim 9, wherein said at least mobile armament is connected to an internal armament closer to said fixed armament.

11. A multichannel coder of the type comprising:

a rotary knob coupled with a code wheel associated with rotation detection means for detecting an angular position and a direction of rotation of the wheel, said knob comprising at least two sensitive zones susceptible of being separately brought into contact with an operator's finger, a channel selection means comprising a fixed capacitor armament integral with a fixed structure of the coder and having a cylindrical tubular shape housed coaxially in a coaxial annular cavity formed in said knob, and at least one mobile capacitor armament integral with the knob and facing said fixed armament so as to form a capacitor therewith, said at least one mobile armament being respectively in electrical contact with only one of said sensitive zones, said selection means providing a channel selection information depending on which of said sensitive zones an operator's finger is in contact with.

* * * * *